United States Patent
Asai et al.

(10) Patent No.: US 10,393,931 B2
(45) Date of Patent: Aug. 27, 2019

(54) GRATING ELEMENT

(71) Applicant: NGK INSULATORS, LTD., Nagoya (JP)

(72) Inventors: Keiichiro Asai, Nagoya (JP); Shoichiro Yamaguchi, Ichinomiya (JP); Jungo Kondo, Miyoshi (JP); Toshihiro Tomita, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 15 days.

(21) Appl. No.: 15/435,409

(22) Filed: Feb. 17, 2017

(65) Prior Publication Data
US 2017/0160450 A1    Jun. 8, 2017

Related U.S. Application Data

(63) Continuation of application No. PCT/JP2015/073529, filed on Aug. 21, 2015.

(30) Foreign Application Priority Data

Aug. 26, 2014  (JP) .................................. 2014-171855

(51) Int. Cl.
*G02B 5/18* (2006.01)
*G02B 6/12* (2006.01)
(Continued)

(52) U.S. Cl.
CPC ............ *G02B 5/1866* (2013.01); *H01S 5/026* (2013.01); *H01S 5/1231* (2013.01); *H01S 5/141* (2013.01);
(Continued)

(58) Field of Classification Search
CPC ........ G02B 5/18; G02B 5/183; G02B 5/1866; G02B 5/188
(Continued)

(56) References Cited

U.S. PATENT DOCUMENTS

| 4,670,093 A | 6/1987 | Maerz et al. |
| 5,601,731 A | 2/1997 | Hillmer |

(Continued)

FOREIGN PATENT DOCUMENTS

| JP | 61-242026 A | 10/1986 |
| JP | H06-003541 A | 1/1994 |

(Continued)

OTHER PUBLICATIONS

International Search Report (With English Translation) and Written Opinion, International Application No. PCT/JP2015/073529, dated Nov. 2, 2015 (10 pages).

(Continued)

*Primary Examiner* — Robert E. Tallman
(74) *Attorney, Agent, or Firm* — Burr & Brown, PLLC

(57) ABSTRACT

A grating device includes an optical material layer; a channel type optical waveguide region provided in the optical material layer; extension regions provided on the outsides of the channel type optical waveguide region, respectively; a Bragg grating provided in the channel type optical waveguide region; and periodic microstructures provided in the extension regions, respectively. The periodic microstructures are provided in 50 percent or larger of a total of areas of the extension regions.

7 Claims, 12 Drawing Sheets

(51) Int. Cl.
  *G02B 6/124* (2006.01)
  *H01S 5/12* (2006.01)
  *H01S 5/14* (2006.01)
  *H01S 5/026* (2006.01)
  *H01S 5/028* (2006.01)

(52) U.S. Cl.
  CPC ........ *G02B 6/124* (2013.01); *G02B 2006/121* (2013.01); *G02B 2006/12107* (2013.01); *G02B 2006/12161* (2013.01); *H01S 5/0287* (2013.01); *H01S 5/1237* (2013.01)

(58) Field of Classification Search
  USPC ........................................ 359/566, 568, 569
  See application file for complete search history.

(56) References Cited

U.S. PATENT DOCUMENTS

| | | |
|---|---|---|
| 6,410,416 B1 | 6/2002 | Dodabalapur et al. |
| 2004/0020893 A1 | 2/2004 | Drake et al. |
| 2006/0072891 A1* | 4/2006 | Lee .................... G02B 6/124 |
| | | 385/129 |
| 2011/0103762 A1* | 5/2011 | Lee .................. G02B 6/12007 |
| | | 385/141 |

FOREIGN PATENT DOCUMENTS

| | | |
|---|---|---|
| JP | 2001-350040 A | 12/2001 |
| JP | 2002-134833 A | 5/2002 |
| JP | 2003-131028 A | 5/2003 |
| JP | 2004-317753 A | 11/2004 |
| JP | 2006-106749 A | 4/2006 |
| JP | 2014-239222 A | 12/2014 |

OTHER PUBLICATIONS

"Nanoimprint Technology and its Application to Optical Devices," *Monthly Display*, dated Jun. 2007, pp. 54-61 (8 pages).

English translation of International Preliminary Report on Patentability (Chapter I) (Application No. PCT/JP2015/073529) dated Mar. 9, 2017 (6 pages).

* cited by examiner

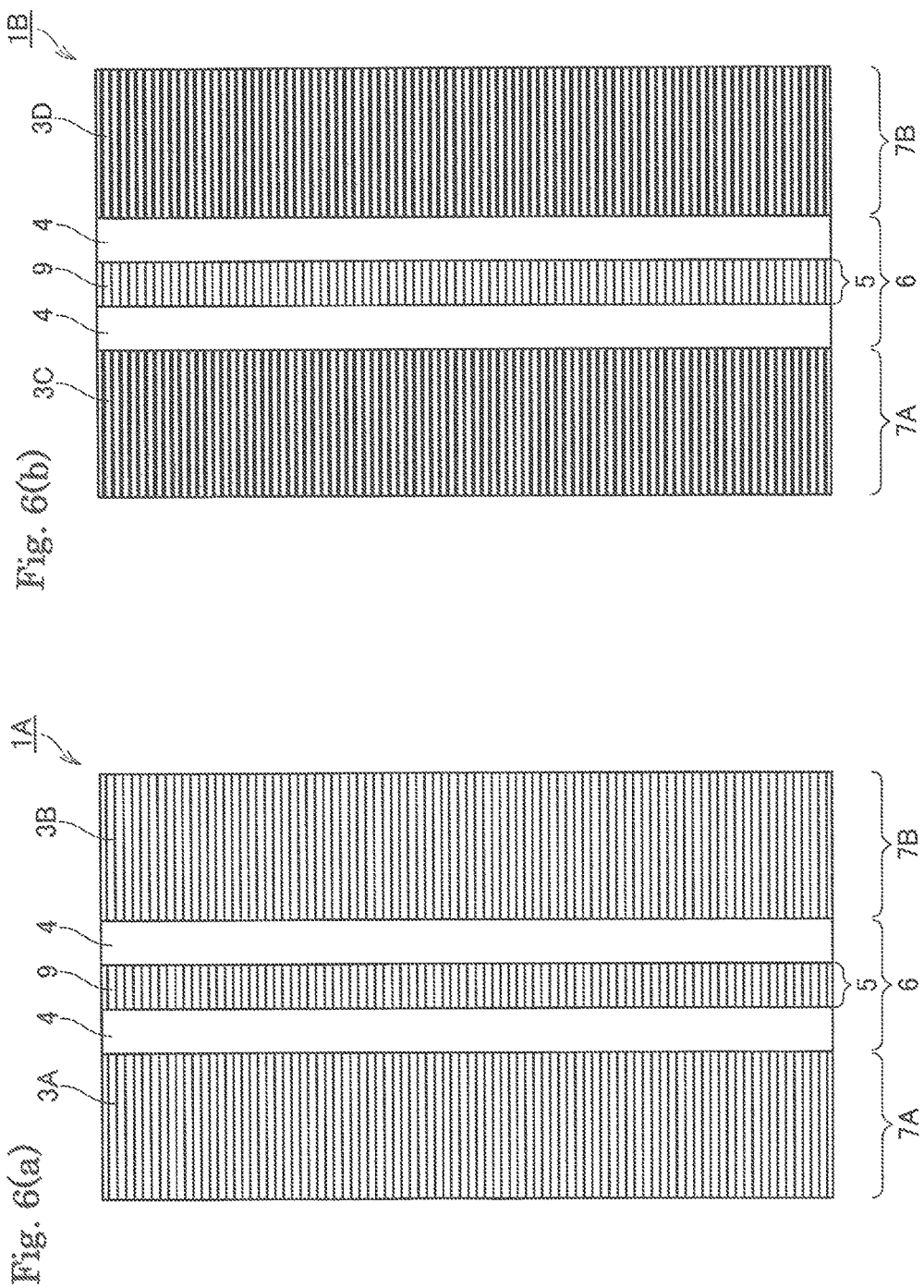

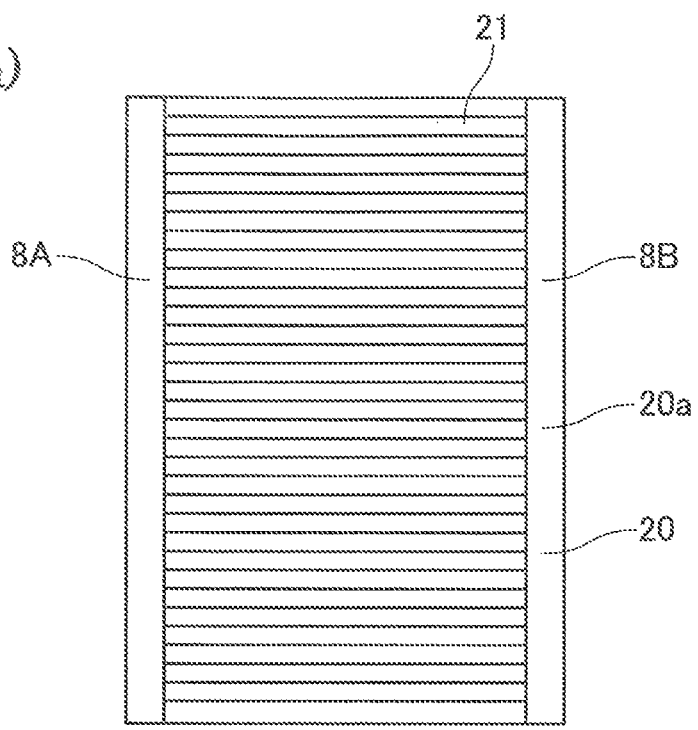
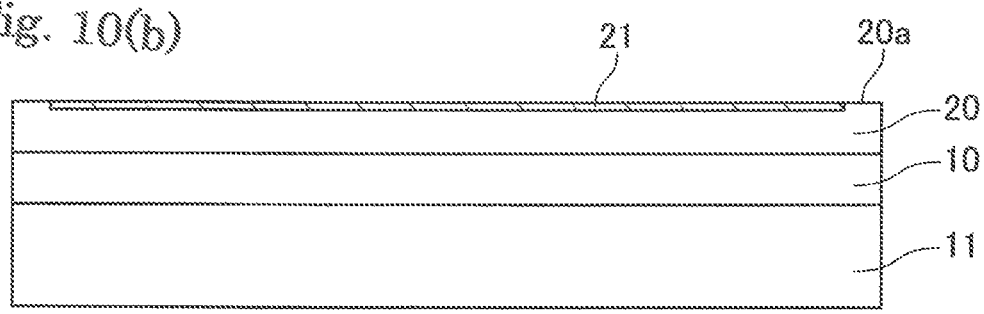

GRATING ELEMENT

TECHNICAL FIELD

The present invention relates to a grating device.

BACKGROUND ARTS

In order to realize a semiconductor laser having wavelength stability, there may be exemplified a DBR laser and a DFB laser in which a grating is monolithically formed in the semiconductor laser, and an external cavity laser in which a fiber grating (FBG) is attached to the outside of the laser. These lasers are based on the principle that a portion of the laser light is returned to the laser by using a mirror having the wavelength selectivity utilizing the Bragg reflection to achieve the stable wavelength operation.

The DBR laser achieves a resonator by forming concave and convex portions at a waveguide surface on the extension of a waveguide of an active layer by the Bragg reflection. Since this laser is provided with diffraction gratings on the both ends of an optical waveguide layer, a light emitted from the active layer propagates through the optical waveguide layer, whereby a portion thereof is reflected by this diffraction grating and is then returned to a current injection part to be amplified. Since only a light having a specific wavelength is reflected in a predetermined direction from the diffraction grating, the wavelength of the laser light becomes constant.

Moreover, as this application, there have been developed an external cavity type semiconductor laser in which the diffraction grating is a component different from the semiconductor and a resonator is formed outside the semiconductor. The type of the laser results in a laser excellent in the wavelength stability, the temperature stability and the controllability. As the external resonator, there are fiber Bragg gratings (FBG) and a volume hologram gratings (VHG). Since the diffraction grating is constituted as a member different from the semiconductor laser, there is such a feature that the reflectivity and the resonator length can be individually designed. Since it is not subjected to the influence of temperature elevation by heat generation due to current injection, the wavelength stability can be further improved. In addition, the diffraction grating may be designed in conjunction with the resonator length, because the change in the refractive index of the semiconductor depending on the temperature is different from that of the diffraction grating, thereby making it possible to enhance the temperature stability.

Patent Document 1 (Japanese Patent Publication No. 2002-134833A) discloses an external cavity laser utilizing a grating formed at a quartz glass waveguide. This aims at providing a laser with the frequency stability, which can be used, without a temperature controller, under an environment where the room temperature greatly changes (e.g. 30° C. or higher). In addition, it describes that there is provided a temperature independent laser in which mode hopping is suppressed and there is no temperature dependency of the oscillation frequency.

It has been examined to use a nanoimprinting method as a method for forming a diffraction grating possessed by a semiconductor laser device. Adoption of the nanoimprinting method for forming the diffraction grating has an advantage that manufacturing costs of devices such as semiconductor laser and so forth can be reduced.

When forming a diffraction grating by nanoimprinting method, a resin layer is first formed on a semiconductor layer to form the diffraction grating. Then, a mold possessing the pattern of grooves and bumps corresponding to shape of this diffraction grating is pressed to this resin layer, and the resin layer is cured in that state. In this manner, the pattern of grooves and bumps of the mold is transferred to the resin layer. Then, a microstructure is formed in a semiconductor layer by transferring the shape of this resin layer to the semiconductor layer.

It has been disclosed in NON-PATENT DOCUMENT 1 that a nanoimprint technology is applied to prepare optical devices. A wavelength selective element, a reflection controlling element, a moth-eye structure and so forth are exemplified as such optical devices.

Patent Documents

PATENT DOCUMENT 1: JP 2002-134833A
PATENT DOCUMENT 2: JP 5641631B

Non-Patent Documents

NON-PATENT DOCUMENT 1: Monthly DISPLAY June Issue (2007) pages 54-61 "Nanoimprint technology and its application to optical devices"

SUMMARY OF THE INVENTION

The inventors disclosed the structure, in the patent document 2, that a ridge type optical waveguide is formed in an optical material layer and convex and concave portions are formed on an upper face of a ridge portion of the ridge type optical waveguide to provide a Bragg grating. According to the structure, the Bragg grating is formed on the ridge portion, and extension portions are formed on the outsides of the edge portion, respectively, to form a slab. The Bragg gratings are not formed on the extension portions.

The inventors have encountered the following problems in the course of actually producing the devices as described above in a large scale.

That is, many grating devices are formed in a single wafer at the same time and then cut out from the wafer. At this time, when the Bragg gratings are formed in the wafer, the width of the Bragg grating is made larger than the width of the optical waveguide by a precision of patterning +α, so that the Bragg gratings can be formed assuredly over the whole surface of the upper face of the ridge portion.

However, as the grating devices were actually produced, it was proved that, in addition to light having a desired wavelength using the Bragg grating, unnecessary light of slab mode was emitted.

Further, although the Bragg gratings can be formed by EB drawing, stepper or the like, it was tried to produce the Bragg gratings by applying nanoimprinting method suited for mass production. However, during the formation of the Bragg gratings, irregularity of the precision of the pitch may occur due to the defects of filling of a resin and elongation of the resin during the release from a mold.

An object of the present invention is, in a device type of forming a Bragg grating in a channel type optical waveguide region, to provide a structure in which light of a predetermined wavelength can be emitted from the waveguide and unnecessary light of slab mode can be refrained from emitting.

The present invention provides a grating device comprising:
an optical material layer;
a channel type optical waveguide region provided in the optical material layer;

extension regions provided on the outsides of the channel type optical waveguide region, respectively;

a Bragg grating provided in the channel type optical waveguide region; and periodic microstructures provided in the extension regions, respectively;

wherein the periodic microstructures are provided in 50 percent or larger of a total of areas of the extension regions.

The inventors have studied the reason that the unnecessary light of slab mode is emitted with the light of a desired wavelength in the device of the type of forming the Bragg grating on the channel type optical waveguide region, and found the followings. That is, as shown in FIG. 4, it is provided that a channel type optical waveguide region 6 is provided in an optical waveguide layer 2 and that extension regions 7A and 7B are provided on both sides of the channel type optical waveguide region 6, respectively. In this case, incident light A from a light source propagates in a ridge portion with Bragg grating 9 provided and then emitted as an arrow D. At this time, a part of the incident light A is leaked from the ridge portion into the extension portions 18A and 18B on the outside of the ridge grooves 4. It is proved that the leaked light is relatively resistive against the scattering and most of it is emitted from an emitting face as an arrow C.

The reason would be speculated as follows. That is, the Bragg grating is not formed in the respective extension portions 18A, 18B or the width is small if it would be formed therein. It is thus considered that the scattering of the light leaked from the ridge portion 4 would not be sufficiently performed.

Here, as shown in FIG. 5, the inventors have tried to form Bragg grating 3A and 3B widely over the respective extension portions. As it is required a cost for producing the Bragg gratings, it has not been even tried to form a Bragg grating in the extension portions as a specification. It is thus proved that the light E leaked from the channel type optical waveguide region is sufficiently scattered in the respective Bragg gratings 3A and 3B and not emitted from the device. The present invention is made based on the discovery.

BRIEF DESCRIPTION OF THE DRAWINGS

FIGS. 6(a) and 6(b) are plan views showing devices according to the present invention, respectively.

FIG. 10(a) is a plan view showing state of forming a Bragg grating 21 on the optical material layer 20, and FIG. 10(b) is a cross sectional view showing state of forming the Bragg grating 21 on the optical material layer 20.

EMBODIMENTS FOR CARRYING OUT THE INVENTION

The present invention will be further described in detail, appropriately referring to attached drawings.

Figure 1:
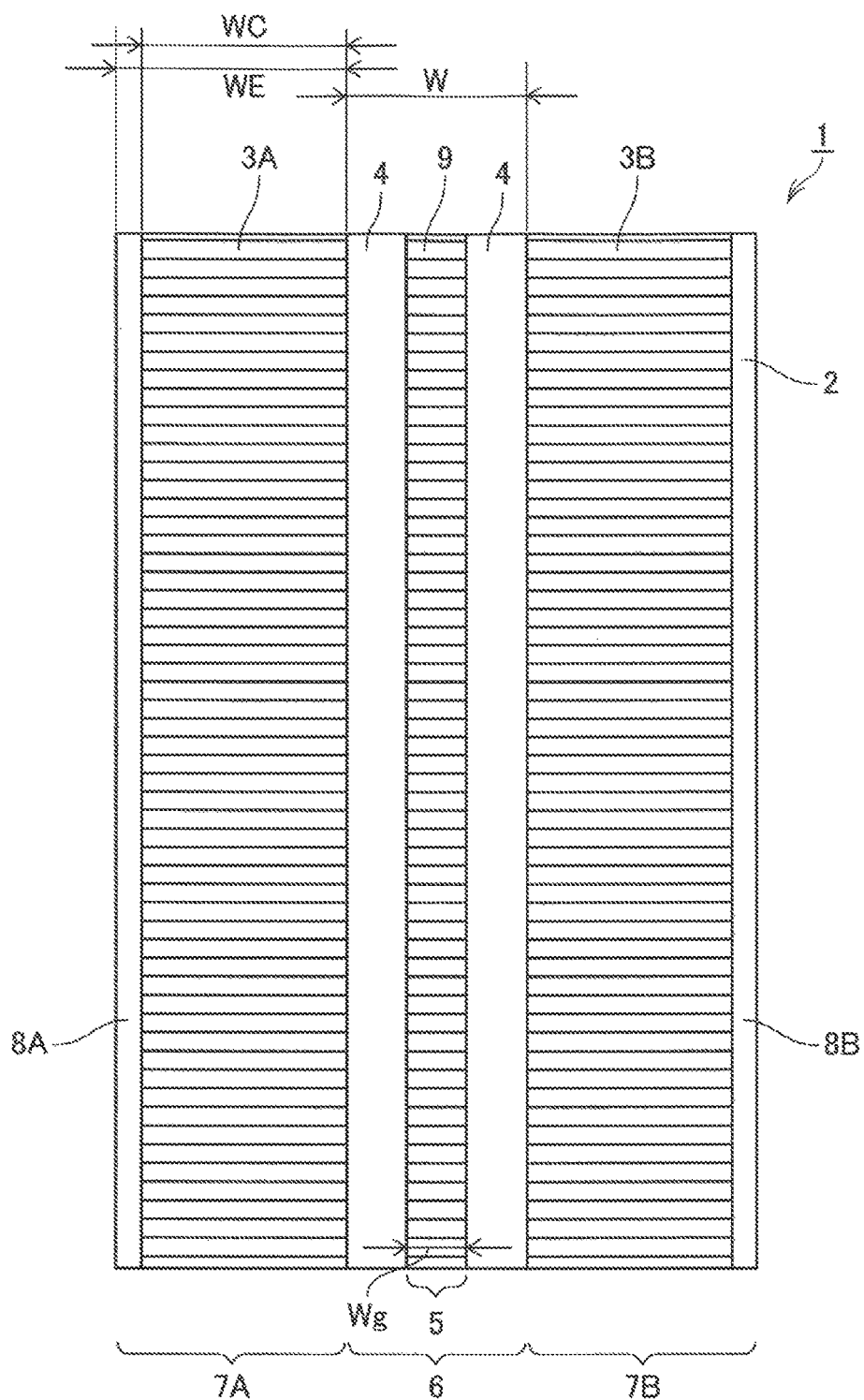
FIG. 1 is a plan view of a grating device 1 according to an embodiment of the present invention.
Figure 3:
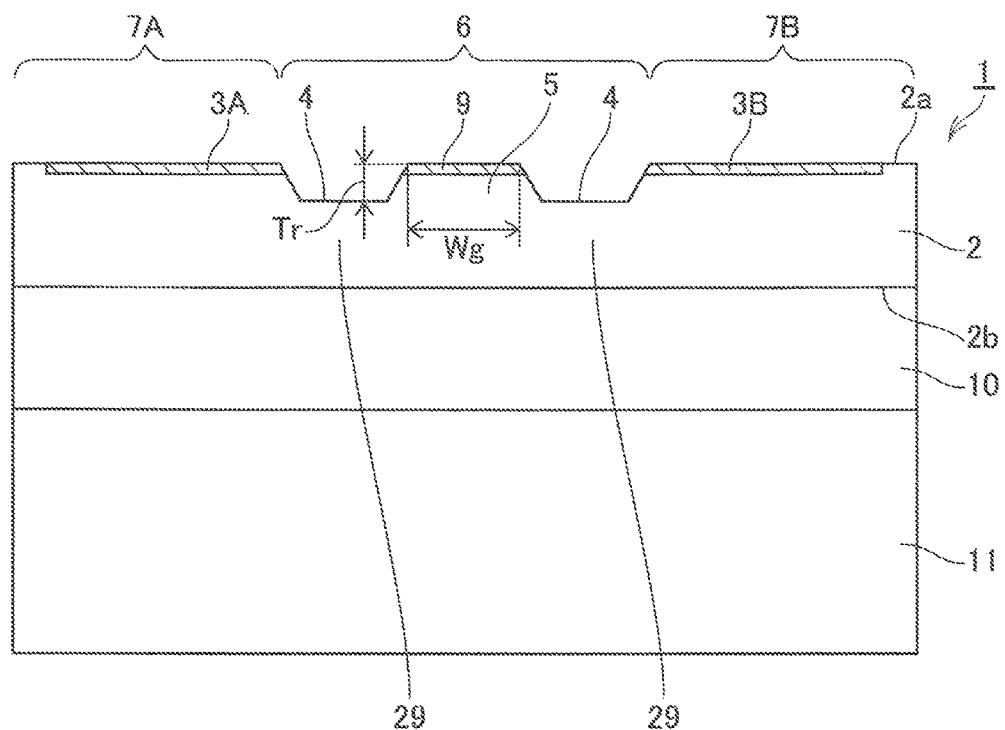
FIG. 3 is a cross sectional view schematically showing the grating device 1.

FIGS. 1 and 3 show a grating device 1 according to an embodiment of the present invention.

According to the device 1 of the present embodiment, an optical material layer 2 includes a pair of main faces 2a and 2b. A pair of ridge grooves 4 is formed, for example, on the side of the main face 2a of the optical material layer 2, and a ridge portion 5 is formed between the pair of the ridge grooves 4. A channel type optical waveguide region 6 is composed of the ridge portion 5 and the ridge grooves 4.

According to the present example, a Bragg grating 9 is formed on an upper face of the ridge portion 9, so that an external type resonator can be constituted together with a light source not shown. Preferably, it may be further provided an incident side propagation portion and emitting side propagation portion each without grating.

A channel type optical waveguide is not limited to a ridge type optical waveguide and includes a diffusion type optical waveguide such as a proton exchange type or titanium diffusion type optical waveguides. In this case, the channel type optical waveguide region is assigned to a diffused region. It is further possible to diffuse a metal into the ridge portion by metal in-diffusion process to raise the refractive index.

According to the present example, extension regions 7A and 7B are formed on the outsides of the respective ridge grooves of the ridge portion. Periodic microstructures 3A and 3B are then formed in the extension regions 7A and 7B, respectively. According to the present embodiment, the periodic microstructures 3A and 3B are composed of Bragg gratings, whose pitches are same as that of the Bragg grating 9, respectively. Further, on the outsides of the periodic microstructures 3A and 3B, regions 8A and 8B are exposed, respectively, which are not covered with the periodic microstructures.

Figure 2:
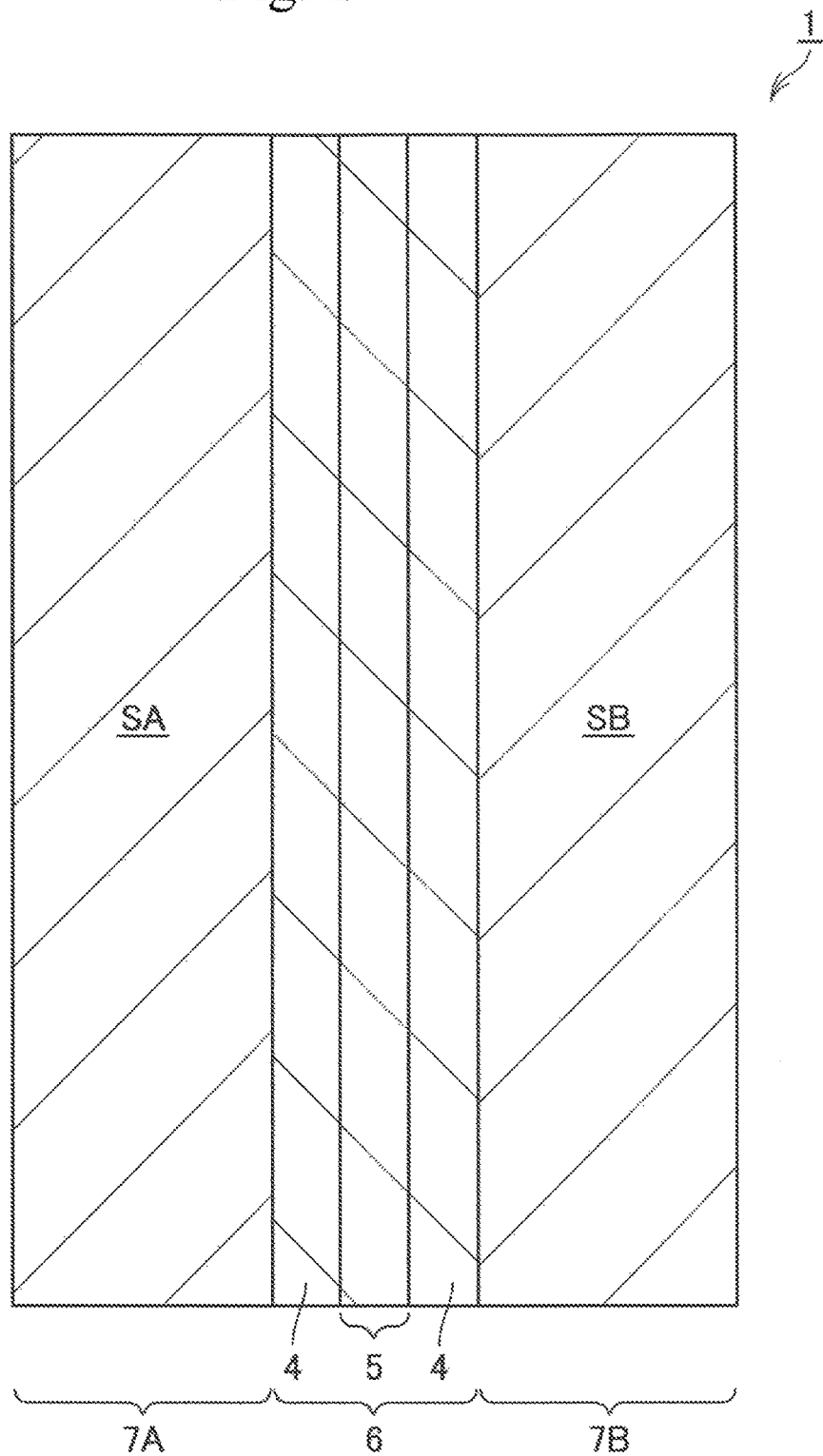
FIG. 2 is a diagram showing regions of a surface of the device 1.

Here, as shown in FIG. 2, for example, extension regions 7A and 7B are provided on the outsides of the respective ridge grooves of the channel type optical waveguide region 6. Then, SA is assigned to an area of the extension region 7A, SB is assigned to an area of the extension region 7B, and (SA+SB) is assigned to the total of them. According to the present invention, the periodic microstructures are provided over a half or more (50 percent or more) of (SA+SB), so that it is possible to facilitate the scattering of light leaked from the channel type optical waveguide to the outside to prevent the emission of the light.

On the viewpoint of the present invention, the periodic microstructures may preferably be provided over 50 percent or more, more preferably 60 percent or more, of the total value (SA+SB) of the areas of the extension regions.

Further, on the viewpoint of the present invention, the periodic microstructures may cover the whole surface (100 percent) of the total value (SA+SB) of the areas of the extension regions.

Figure 4:
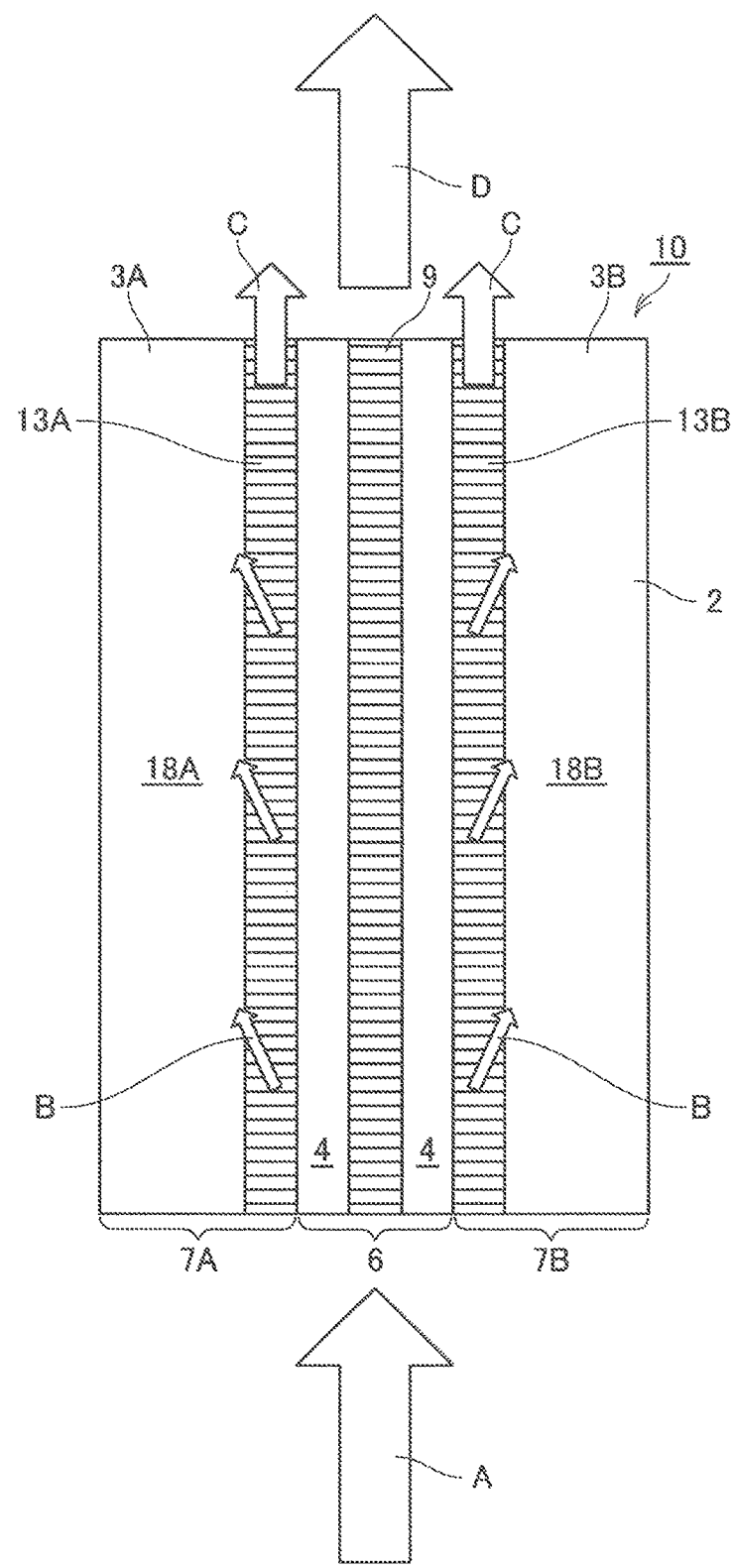
FIG. 4 is a plan view showing a device 10 according to a comparative example.

That is, in the case that the periodic microstructure such as Bragg grating is not provided, or provided over a small area on the viewpoint of the production tolerance, on the extension portion other than the channel type optical waveguide region as shown in FIG. 4, it was proved that unnecessary light C of slab mode is emitted from the emitting face according to the reasons described above.

Figure 5:
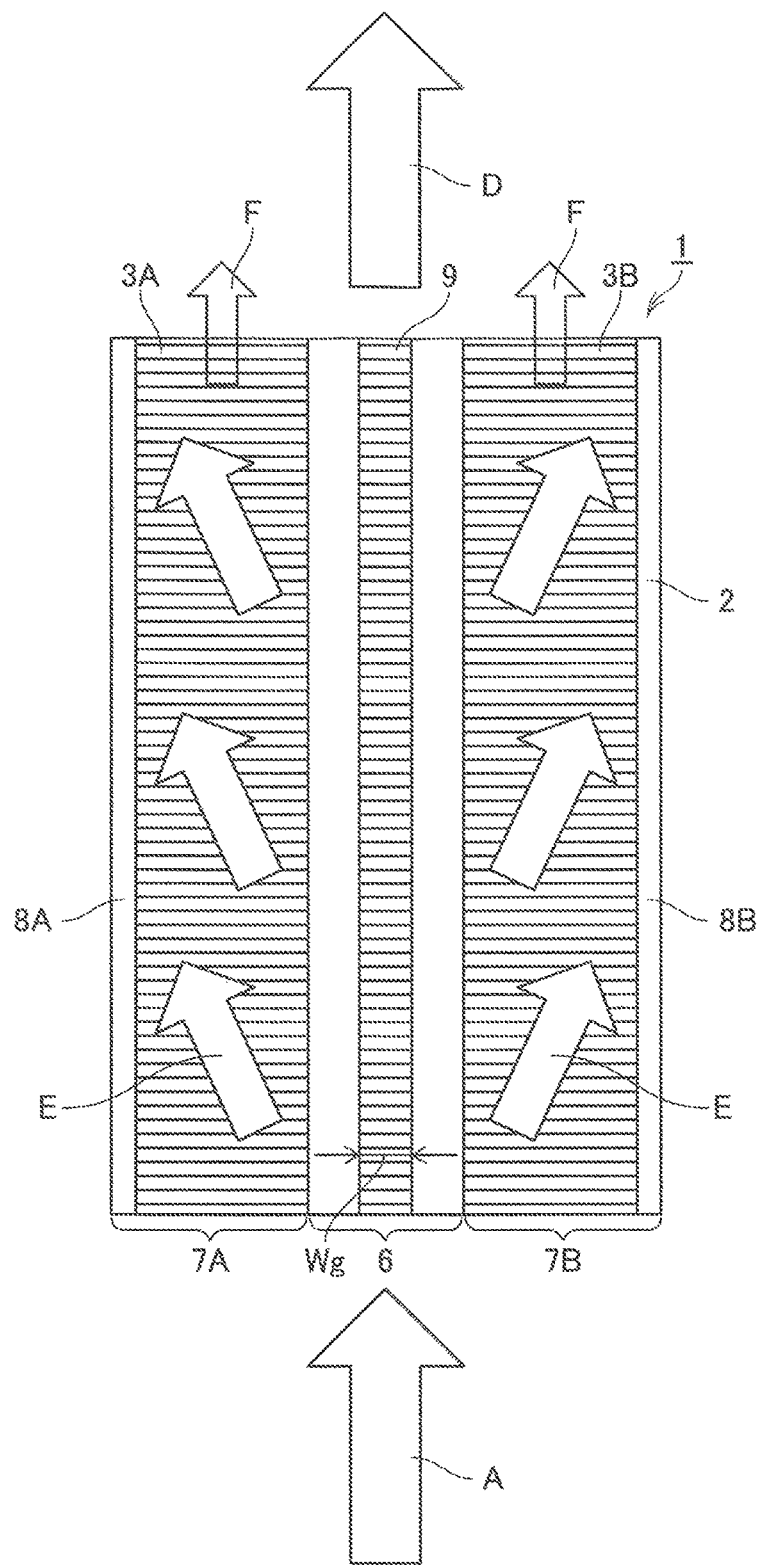
FIG. 5 is a diagram for illustrating effects of the inventive device 1.

Contrary to this, according to the present invention, as shown in FIG. 5, light E is leaked from the channel type optical waveguide region 6 and then fully scattered in the respective periodic microstructures 3A and 3B. The emission of the light as shown in an arrow F can be thereby prevented.

According to a preferred embodiment, it is provided a clad layer contacting the optical material layer and a supporting body supporting the optical material layer and the clad layer. For example, according to the embodiment of FIG. 3, the clad layer 10 is provided on the supporting body 11, and the optical material layer 2 is provided on the clad layer 10. The channel type optical waveguide region as described above is provided on the optical material layer 2. 29 denotes a thin layer part under the ridge grooves 4.

The periodic microstructure means a structure in which a predetermined microstructure is formed at a specific pitch or interval. The microstructure means a structure in which the structure has dimensions capable of interfering with light propagating in the channel type optical waveguide. According to a preferred embodiment, the pitch of the microstructure may be 700 nm or smaller and more preferably by 500 nm or smaller.

Further, in the case that the Bragg grating and the periodic microstructure are formed on the main face of the optical material layer, on the viewpoint of the present invention, the depths of them may preferably be 10 nm or larger and more prefer be 40 nm or larger. The upper limits of the depths are not particularly defined, and the Bragg grating or the microstructure may be formed through the optical material layer. On the viewpoint of the actual production, the depths may preferably be 300 nm or smaller.

Further, according to a preferred embodiment, the periodic microstructure is composed of a Brag grating, pillars arranged periodically or holes arranged periodically. The pitch of the periodic microstructure may be same as or different from the pitch of the Bragg grating provided on the channel type optical waveguide region. Further, the shape of the pillars or holes is not particularly limited. For example, the pillar may be a cylinder, a prism such as Quadrangular prism or hexagonal prism, a cone or geometrical pyramid.

According to a preferred embodiment, the periodic microstructure is provided so as to contact the channel type optical waveguide region. It is thus possible to effectively scatter the light leaked from the channel type optical waveguide region.

According to a preferred embodiment, the periodic microstructure is provided over the whole length of the channel type optical waveguide region. It is thus possible to effectively scatter the light leaked from the channel type optical waveguide over the whole length of the channel type optical waveguide.

According to a preferred embodiment, the Bragg grating and the periodic microstructures are provided on the one main face of the optical material layer. In this case, they may be provided on the surface or a bottom face 2b. However, the Bragg grating and the periodic microstructures may be included in the optical material layer. In this case, the Bragg grating and the periodic microstructures are not exposed to the main face of the optical material layer.

According to a device 1A shown in FIG. 6(a), the Bragg grating 9 is provided in the channel type optical waveguide region 6, and the Bragg gratings 3A and 3B are provided in the extension portions, respectively. According to the present example, the Bragg gratings are provided over the whole surfaces of the respective extension portions. However, there may be left portions 8A and 8B, in which the Bragg gratings are not provided, in the respective extension portions.

According to a device 1B shown in FIG. 6(b), the Bragg grating 9 is provided in the channel type optical waveguide region 6, and the Bragg gratings 3C and 3D are provided in the extension portions 7A and 7B, respectively. According to the present example, the pitches of the Bragg gratings 3C and 3D on the extension portions 7A and 7B are different from that of the Bragg grating 9 in the channel type optical waveguide region.

Figure 7B:
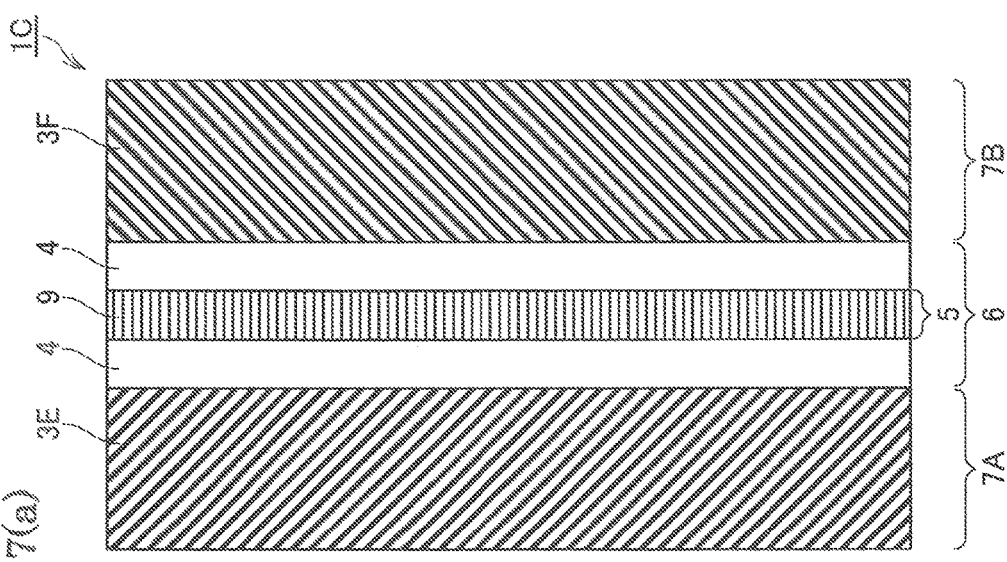
FIGS. 7(a) and 7(b) are plan views of devices according to the present invention, respectively.
Figure 7A:
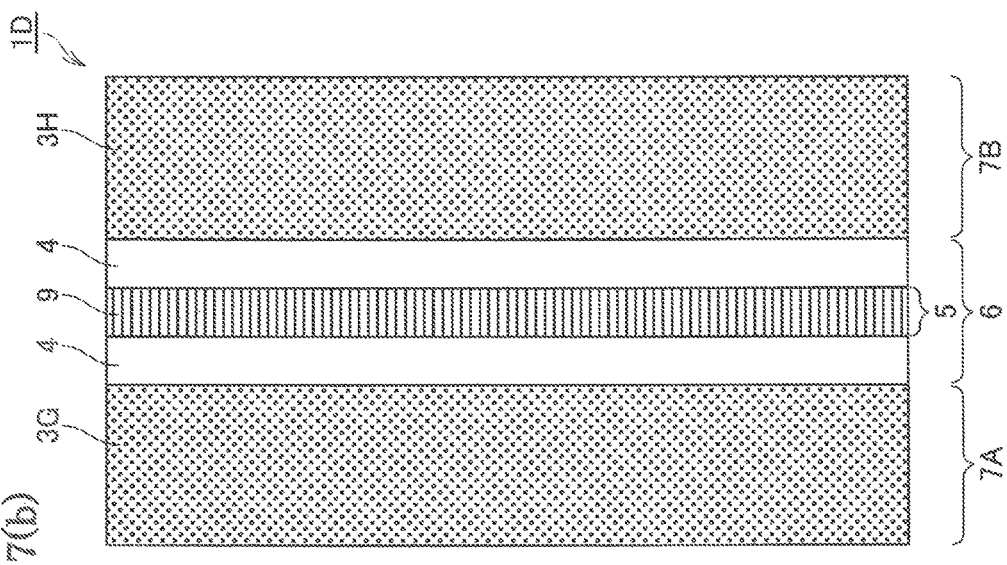

According to a device 1C shown in FIG. 7(a), the Bragg grating 9 is provided in the channel type optical waveguide region 6, and the Bragg gratings 3E and 3F are provided in the extension portions 7A and 7B, respectively. According to the present example, the direction of the Bragg gratings 3E and 3F on the extension portions diagonally intersects that of the Bragg grating 9 in the channel type optical waveguide region. Such angle of intersection may preferably be 0 to ±80°, although it can be appropriately determined on the viewpoint of efficiency of scattering.

According to a device 1D shown in FIG. 7(b), the Bragg grating 9 is provided in the channel type optical waveguide region 6, and the periodic microstructures 3G and 3H are provided in the extension portions 7A and 7B, respectively. According to the present example, the periodic microstructures on the extension portions are composed of many protrusions or holes regularly arranged. It is preferred that the hole does not penetrate through the optical material layer.

Figure 8:
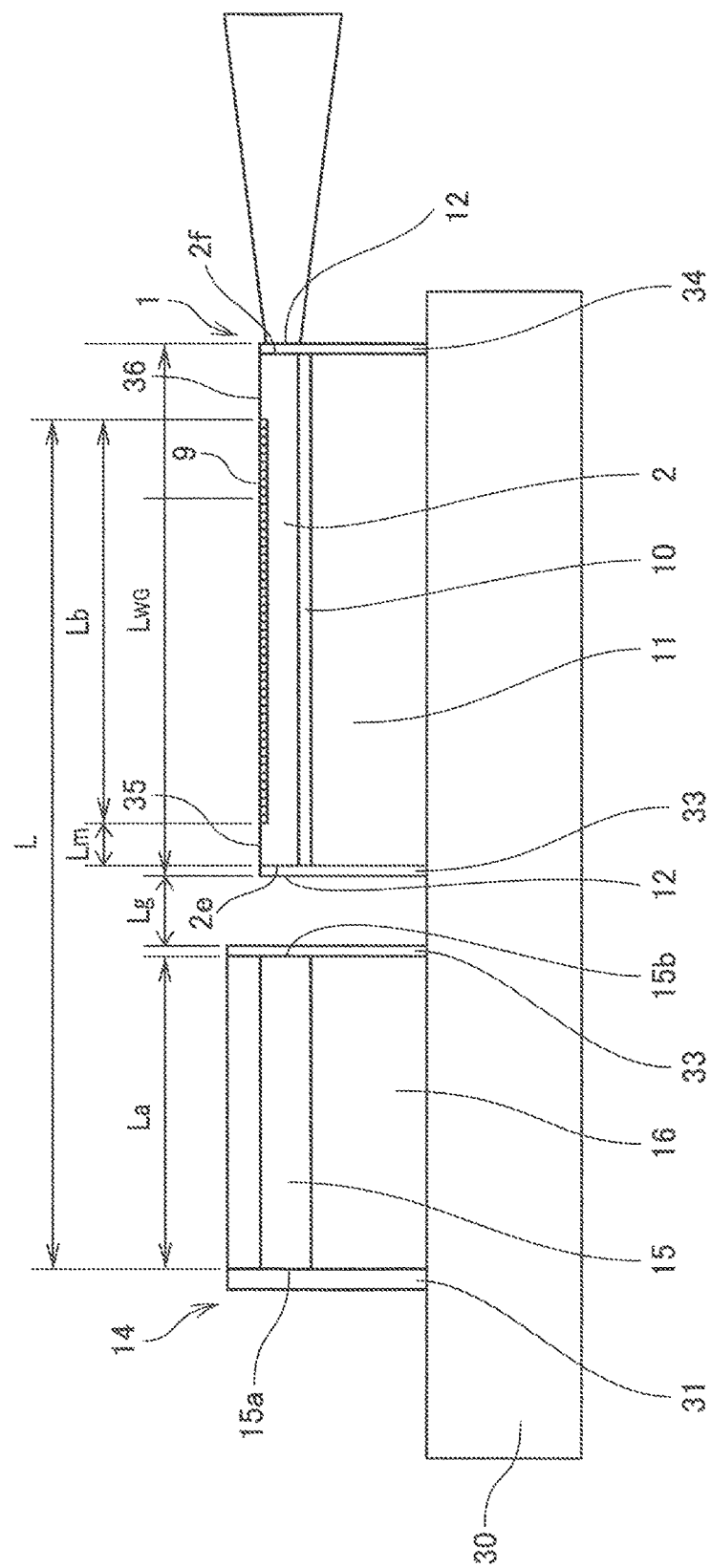
FIG. 8 shows an example of a light emitting unit using the inventive grating device.

FIG. 8 schematically shows an example of an external resonator type light emitting system. The system includes a light source 14 oscillating a semiconductor laser light and a grating device 1. The light source 14 and grating device 1 are mounted on a common substrate 30.

The light source 14 comprises an active layer 15 for oscillating the semiconductor laser light. According to the present embodiment, the active layer 15 is provided in a substrate 16. A reflection film 31 is provided at an outer side end face 15a of the active layer 15, and a non-reflection film 32 is formed at an end surface on the grating element side of the active layer 15. La represents a length of the active layer in a direction of optical axis.

It is enough that the reflectance at the end face 15b is lower than that of the grating, and a conventional semiconductor laser system may be used as the light source 14.

According to the grating device 1, on a supporting body 11, it is provided the optical material layer 2 including an incident face 2a, onto which the semiconductor laser light is made incident, and an emitting face 2f, from which an emission light is emitted. The Bragg grating as described above and the extension portions are formed in the optical material layer 2.

According to the present embodiment, an incident side propagation portion 35 without a grating is provided between an incident face 2e of the optical material layer and Bragg grating 9. The incident side propagation portion faces the active layer 15 through a space. 33 denotes a non-reflection film provided on the side of the incident face of the optical material layer 2. An emitting side propagation portion 36 without a grating is provided between an emitting face 2f of the optical material layer and Bragg grating 9. 34 denotes a non-reflection film provided on the side of the emitting face of the optical material layer.

However, it is enough that each reflectivity at the incident face and emitting face of the optical material layer 2 is smaller than that of the grating. In this case, the non-reflection film may be omitted.

It will be described below a preferred manufacturing process of the inventive device.

Figure 9A:
FIGS. 9(a), (b) and (c) show process of forming a clad layer 10 and an optical material layer 20 om a supporting body 11.
Figure 9B:
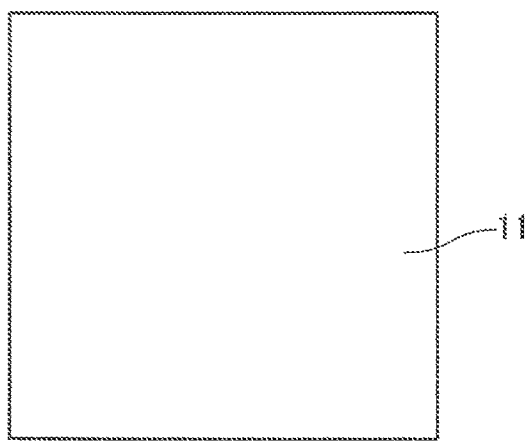
Figure 9C:
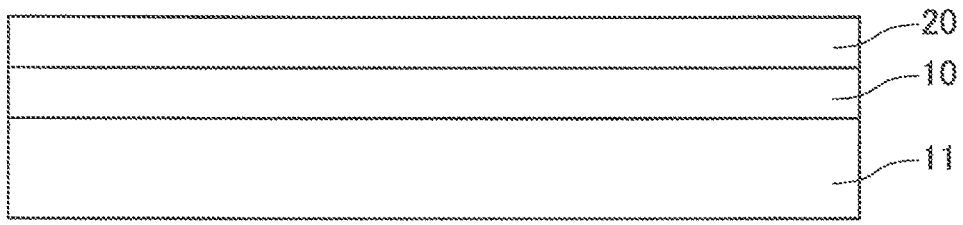

FIG. 9(a) is a front view of a supporting body 11, and FIG. 9(b) is a plan view of the supporting body 11. A clad layer 10 and an optical material layer 20 are formed on the supporting body 11 (FIG. 9(c)). An upper side clad layer may be further provided on the surface of the optical material layer. Each of the optical material layer, clad layer and the upper clad layer may be composed of a single layer or multi-layered film.

Specific materials for the support body are not particularly limited, and lithium niobate, lithium tantalate, AlN, SiC, ZnO, a glass such as quartz glass or the like, synthetic quartz, quartz crystal, Si, sapphire and so forth can be exemplified. On the viewpoint of ease of processing of the supporting body, the material of the supporting body may preferably be a glass such as quartz glass or the like, synthetic quartz, quartz crystal or Si.

In terms of handling, the support body preferably has a thickness of 250 µm or more, and further, in terms of downsizing, the support substrate preferably has a thickness of 1 mm or less.

The optical material layer is preferably formed of an optical material such as silicon oxide, zinc oxide, tantalum oxide, lithium niobate, lithium tantalate, titanium oxide, hafnium oxide, aluminum oxide, niobium pentoxide, magnesium oxide or the like. Further, the optical material layer preferably has a refractive index of 1.7 or more, and more preferably has a refractive index of 2.0 or more.

In order to further improve optical damage resistance of the optical waveguide, at least one kind of metal element selected from the group consisting of magnesium (Mg), Zinc (Zn), scandium (Sc) and indium (In) may be contained in the optical material layer. In this case, magnesium is specifically preferable. Further, a rare earth element may be contained in a crystal as a doping component. Nd, Er, Tm, Ho, Dy and Pr are specifically preferable as the rare earth element.

Thickness of the optical material layer is not specifically limited, but a thickness of 0.5-3 µm is preferable in terms of reducing a propagation loss of light.

In the case that the clad layer is provided, it is possible to reduce the leakage of the propagating light into the supporting body by making the thickness of the clad layer larger. On the viewpoint, the thickness of the clad layer may preferably be 0.5 µm or larger.

The clad layer and the upper side clad layer each are formed of a material having a refractive index lower than that of a material of the optical material layer, but may be formed of silicon oxide, tantalum oxide, or zinc oxide, for example. Further, the clad layer and the upper side clad layer each may be doped therewith to adjust the refractive index. P, B, Al and Ga may be exemplified as such a dopant.

The optical material layer, the clad layer and the upper side clad layer each may be film-formed by a thin film forming method. Sputtering, vapor evaporation, and CVD can be exemplified as such the thin film forming method.

Then, as shown in FIGS. 10(a) and (b), a Bragg grating 21 is formed on the optical material layer 20. Then, predetermined ridge grooves 4 are formed to obtain the channel type optical waveguide region and the extension portion as shown in FIGS. 1 and 3, and the Bragg gratings 9, 3A and 3B are then formed.

According to the example of FIG. 10, the Bragg grating in the channel type optical waveguide region and the periodic microstructures in the extension portions are composed of Bragg gratings having a same pitch. However, as shown in FIGS. 6 and 7, in the case that the periodic microstructure in the extension portion is different from the Bragg grating in the channel type optical waveguide region, it is necessary that the periodic microstructures are provided in the optical material layer.

The Bragg grating and periodic microstructures can be formed by etching using a mask. Such etching includes dry etching and wet etching. Examples of the dry etching thereof include reactive etching and so forth, for example, and as gaseous species, fluorine based and chlorine based ones may be exemplified. The wet etching includes fluoric acid based or TMAH based etching, for example.

Figure 11:
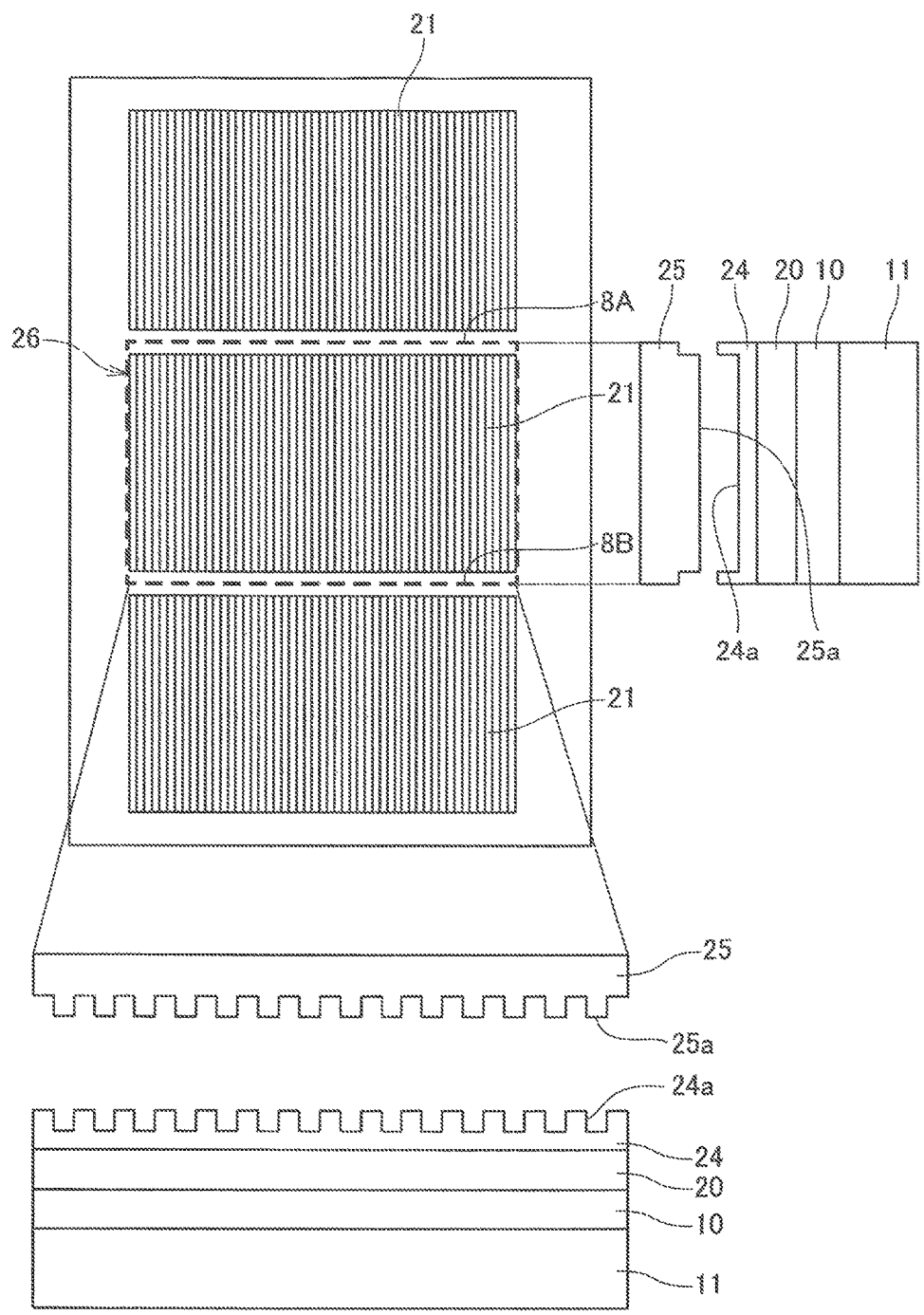
FIG. 11 is a diagram for illustrating benefits of the present invention in producing a Bragg grating by imprinting method.

Further, the Bragg grating and periodic microstructures may preferably be formed by imprinting method. In this case, for example as shown in FIG. 11, a resin layer 24 is formed on the optical material layer 20. Then, an imprinting mold 25, onto which a design pattern 25a is transferred, is transferred onto the resin layer 24 to form a pattern 24a on the resin layer 24. Thereafter, the pattern 24a is transferred onto the optical material layer 20 by etching.

In the case where the resin layer 24 is made of a thermoplastic resin, the resin layer 24 is softened by heating the resin layer to the softening point of the resin or higher, and the resin can be deformed by pressing the mold 25 thereto. The resin layer 24 is cured during cooling that follows. In the case where the resin layer is made of a thermosetting resin, the resin is deformed by pressing the mold to an uncured resin layer 24, and can be subsequently cured by heating the resin layer to the polymerization temperature of the resin or higher. In the case where the resin layer 24 is formed of a photo curable resin, deformation is produced by pressing the mold 25 to the uncured resin layer 24 to transfer the design pattern, and curing can be carried out by exposing the resin layer 24 to light.

After the design pattern 25a is transferred on the resin layer 24, the optical material layer 20 is subjected to etching to form the fine pattern on the optical material layer. At this time, the resin layer may be masked or a separate mask material layer may be formed between the resin layer and optical material layer.

The following effects can be obtained by forming the Bragg grating and periodic microstructures by imprinting method.

Figure 12:
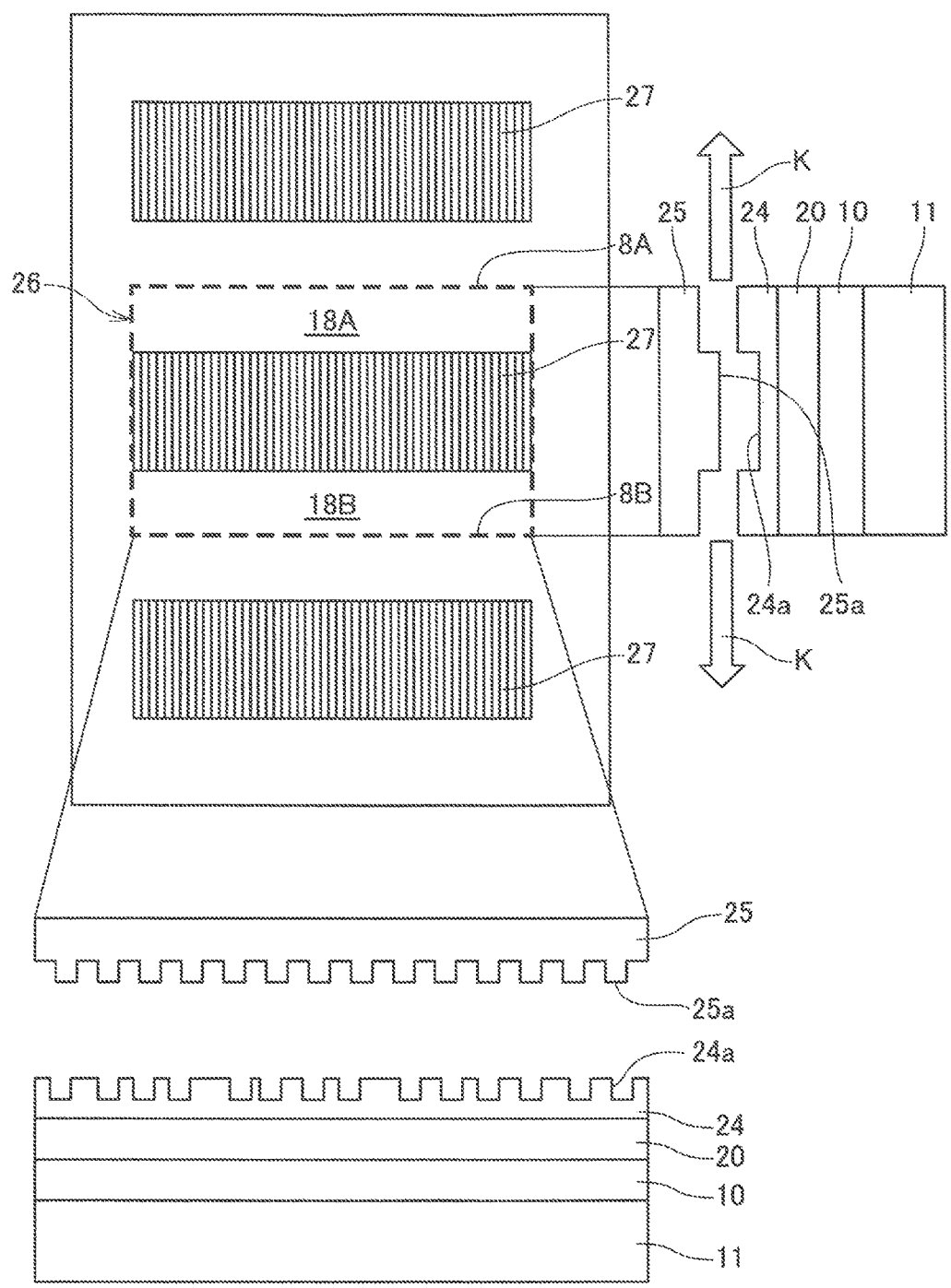
FIG. 12 is a diagram for illustrating problems, in producing a Bragg grating by imprinting method.

That is, as shown in FIG. 12, in the case that the regions 18A and 18B, with no Bragg grating and periodic microstructures formed, are large, the positional shift of an imprinting mold in horizontal direction may tend to occur, during filling of a resin in transferring using the mold and the release from the mold. The resin-filled portion does not become uniform in the device and the precision of the pitch of the grating tends to be uneven in the waveguide region. On the contrary, according to the present invention, in the case that the periodic microstructure of a large area is formed in the respective extension portion (refer to FIG. 11), the regions 8A and 8B with no periodic microstructures formed are small, so that the width of the transferred portion becomes large. It is thus possible to prevent the change of the pattern of the resin layer during the filling of the resin and release from the mold, so that the precision of the pitch of the grating can be improved to result in excellent productivity and precision of the pitch.

EXAMPLES

Example 1

It was produced a light emitting system as shown in FIGS. 1, 3, 5 and 8.

Specifically, on a supporting body 11 composed of a silicon wafer, by means of a sputtering apparatus, a lower clad layer 10 made of $SiO_2$ was deposited in a thickness of 1 μm. An optical material layer 20 made of $Ta_2O_5$ in a thickness of 1.2 μm was deposited further. Then, Ti was deposited on the optical material layer to produce a grating pattern by nanoimprinting process. As to the grating pattern, the pitch interval Λ was made 206 nm and the length Lb was made 100 μm.

Thereafter, the Ti film was etched to form a grating pattern of Ti, using a resist pattern, obtained by the nanoimprinting, as a base. Then, the pattern of the Ti film was used as a mask to perform reactive ion etching of fluorine-base to form a Bragg grating having a pitch interval Λ of 206 nm and a length Lb of 100 μm. The depth of the groove of the grating was made 40 nm.

Further, for forming an optical waveguide, the Ti film was formed as the same procedure as described above. The Ti film was patterned by photolithography process using an aligner and the etching process as described above to provide Ti pattern for the optical waveguide. Thereafter, reactive ion etching was performed to form a ridge portion 5 having a width Wg of 3 μm and a depth Tr of 0.6 μm (FIG. 3).

Finally, an $SiO_2$ layer as the upper clad layer was formed in a thickness of 0.5 μm by sputtering to provide an assembly.

Thereafter, the assembly was cut out into bars by a dicing system, both end faces of the bar were subjected to optical polishing, anti-reflection coatings each of 0.1 percent were formed on both end faces, respectively, and the bar was finally cut into chips to produce grating devices. The width and length $L_{WG}$ of the device were made 1 mm and 110 μm, respectively.

However, the Bragg grating 9 was formed on the ridge portion 5 and the Bragg gratings 3A and 3B were formed on the extension portions 7A and 7B, respectively (see FIG. 1). The width WE of the respective extension portions was made 442 μm and the width WC of each of the Bragg gratings 3A and 3B was made 290 μm. Further, (area of the Bragg grating 3A+area of the Bragg grating 3B)/(SA+SB) was made 60 percent, provided that (SA+SB) is assigned to a total of areas of the extension portions.

As to the optical characteristics of the grating device, a super luminescent diode (SLD) as a broadband wavelength light source was used to input the light in the TE mode into the grating device to analyze the output light therefrom by means of an optical spectrum analyzer, thereby evaluating the reflection characteristics from the transmission characteristics. A reflection center wavelength of the measured grating device was 846 nm, the reflectance was 20 percent and the full width at half maximum was 2 nm.

Then, for evaluating the performances of an external resonator type laser using the grating device, a laser module was mounted as shown in FIG. 8. A light source device of GaAs series laser structure type was applied, a high refractive film was provided on one end face of the device, and the reflectance at the other end face was made 10 percent.

Light source device specification:
Central wavelength: 844 nm
Output: 20 mW
Laser device length: 250 μm Mounting specification:
Lg: 0.5 μm
Lm: 5 μm
$L_{WG}$ 110 μm
L: 356 μm
La: 250 μm Driving was conducted under an automatic current control (ACC) without using a Peltier element after the module has been mounted. The laser module had the laser characteristics that oscillation took place at a central wavelength of 846 nm, and an output thereof was 18 mW. Further, the optical spot observed at the emitting side end face of the waveguide was substantially of Gaussian distribution, and it was not observed the light of slab mode irradiated from the substrate.

Example 2

A grating device was produced and evaluated according to the same procedure as that in the Example 1.

However, different from the Example 1, (area of the Bragg grating 3A+area of the Bragg grating 3B)/(SA+SB) was made 50 percent.

As to the optical characteristics of the grating device, a reflection center wavelength was 846 nm, the reflectance was 20 percent and the full width at half maximum was 2 nm.

Driving was conducted under an automatic current control (ACC) without using a Peltier element after the module has been mounted. The laser module had the laser characteristics that oscillation took place at a central wavelength of 846 nm, and an output thereof was 17.5 mW. Further, the optical spot observed at the emitting side end face of the waveguide was substantially of Gaussian distribution, and it was not observed the light of slab mode irradiated from the substrate.

Example 3

A grating device was produced and evaluated according to the same procedure as that in the Example 1.

However, different from the Example 1, (area of the Bragg grating 3A+area of the Bragg grating 3B)/(SA+SB) was made 100 percent.

As to the optical characteristics of the grating device, a reflection center wavelength was 846 nm, the reflectance was 20 percent and the full width at half maximum was 2 nm.

Driving was conducted under an automatic current control (ACC) without using a Peltier element after the module has been mounted. The laser module had the laser characteristics that oscillation took place at a central wavelength of 846 nm, and an output thereof was 18 mW. Further, the optical spot observed at the emitting side end face of the waveguide was substantially of Gaussian distribution, and it was not observed the light of slab mode irradiated from the substrate.

Comparative Example 1

A grating device was produced and evaluated according to the same procedure as that in the Example 1.

However, different from the Example 1, (area of the Bragg grating 3A+area of the Bragg grating 3B)/(SA+SB) was made 45 percent.

As to the optical characteristics of the grating device, a reflection center wavelength was 846 nm, the reflectance was 20 percent and the full width at half maximum was 2 nm.

Driving was conducted under an automatic current control (ACC) without using a Peltier element after the module has been mounted. The laser module had the laser characteristics that oscillation took place at a central wavelength of 846 nm, and an output thereof was 10 mW. Further, although the optical spot observed at the emitting side end face of the waveguide was substantially of Gaussian distribution, it was observed the light of slab mode irradiated from the substrate.

Comparative Example 2

A grating device was produced and evaluated according to the same procedure as that in the Example 1.

However, different from the Example 1, (area of the Bragg grating 3A+area of the Bragg grating 3B)/(SA+SB) was made 20 percent.

As to the optical characteristics of the grating device, a reflection center wavelength was 846 nm, the reflectance was 20 percent and the full width at half maximum was 2 nm.

Driving was conducted under an automatic current control (ACC) without using a Peltier element after the module has been mounted. The laser module had the laser characteristics that oscillation took place at a central wavelength of 846 nm, and an output thereof was 8 mW. Further, although the optical spot observed at the emitting side end face of the waveguide was substantially of Gaussian distribution, it was observed the light of slab mode irradiated from the substrate.

The invention claimed is:

1. A grating device comprising:
an optical material layer;
a channel type optical waveguide region provided in said optical material layer said channel type optical waveguide region comprising first and second ridge grooves and a ridge portion provided between said first and second ridge grooves;
a first extension region provided on a first external surface of said first ridge groove;
a second extension region provided on an opposite second external surface of said second ridge groove;
a first Bragg grating provided in said ridge portion; and
periodic microstructures provided in said first extension regions, respectively, and outside of said ridge grooves, respectively;
wherein at least one of said periodic microstructures comprises a second Bragg grating;
wherein said periodic microstructures are provided in 50 percent or larger of a total areas area of said first and second extension regions.

2. The device of claim 1, wherein each of said periodic microstructures comprises a second Bragg grating.

3. The device of claim 1, wherein said first Bragg grating and said periodic microstructures are formed by an imprinting method.

4. The device of claim 1, wherein said periodic microstructures contact said channel type optical waveguide region.

5. The device of claim 1, wherein said periodic microstructures are provided in a whole length of said channel type optical waveguide region.

6. The device of claim 1, wherein said first Bragg grating and said periodic microstructures are provided on one main face of said optical material layer.

7. The device of claim 1, further comprising a clad layer contacting said optical material layer and a supporting body supporting said optical material layer and said clad layer.

* * * * *